United States Patent
Wehrmann et al.

(10) Patent No.: US 6,395,410 B1
(45) Date of Patent: May 28, 2002

(54) ELECTROLUMINESCENT DEVICES USING BLEND SYSTEMS

(75) Inventors: Rolf Wehrmann, Krefeld; Andreas Elschner, Mühlheim; Emma Thorn-Csanyi, Hamburg, all of (DE)

(73) Assignee: Bayer Aktiengesellschaft, Leverkusen (DE)

(*) Notice: Subject to any disclaimer, the term of this patent is extended or adjusted under 35 U.S.C. 154(b) by 0 days.

(21) Appl. No.: 09/328,069

(22) Filed: Jun. 8, 1999

(30) Foreign Application Priority Data

Jun. 9, 1998 (DE) .......................... 198 25 765

(51) Int. Cl.$^7$ .......................... H01B 1/00; H05B 33/14
(52) U.S. Cl. .......................... 428/690; 428/917
(58) Field of Search .......................... 428/690, 917

(56) References Cited

U.S. PATENT DOCUMENTS

| | | | |
|---|---|---|---|
| 4,539,507 A | 9/1985 | VanSlyke et al. | 313/504 |
| 4,720,432 A | 1/1988 | VanSlyke et al. | 428/457 |
| 4,769,292 A | 9/1988 | Tang et al. | 428/690 |
| 4,885,211 A | 12/1989 | Tang et al. | 428/457 |
| 5,059,863 A | 10/1991 | Tashiro et al. | 313/504 |
| 5,077,142 A | 12/1991 | Sakon et al. | 428/690 |
| 5,247,190 A | 9/1993 | Friend et al. | 257/40 |
| 5,317,169 A | 5/1994 | Nakano et al. | 257/40 |
| 5,328,809 A | 7/1994 | Holmes et al. | 430/321 |
| 5,399,502 A | 3/1995 | Friend et al. | 437/1 |
| 5,401,827 A | 3/1995 | Holmes et al. | 528/374 |
| 5,408,109 A | 4/1995 | Heeger et al. | 257/40 |
| 5,512,654 A | 4/1996 | Holmes et al.. | 528/373 |
| 5,672,678 A | 9/1997 | Holmes et al. | 528/373 |
| 5,726,457 A | 3/1998 | Nakano et al. | 257/40 |
| 5,766,515 A | 6/1998 | Jonas et al. | 252/500 |

FOREIGN PATENT DOCUMENTS

WO     WO 92/03491     3/1992

OTHER PUBLICATIONS

Chem Abstract: 128: 294526 "Relationship . . . Figs (P–Phenylene Vinylene)s" Stalmach 1998.*
128: 230937 "Synthesis . . . Copolymers" Chen et al 1998.*
128: 205315 "Optical Properties . . . Figs (P–Phenylene Vinylene)" Brower et al 1998.*
128: 155001"Synthesis . . . of a Polymer" Zhiyong elt al. 1997.*
124: 364953 "Polymer . . . PPV Materials" Ohnishi et al. 1997.*
128: 108146 "Light Emittings Diodes . . . Chain Lengths" Gebhardt 1997.*
127: 101550 "Oligophenylene Vinylenes . . . Diodes" Goodson et al 1997.*
126: 299531 "Polymers . . . Electroluminescent Materials" Kreuder et al. 1997.*
126: 278031 "Model Compounds . . . Oligomers" Gill et al. 1997.*
126: 278097 "A Blue Light . . . Functional Units" Li et al. 1997.*
126: 278090 "New CF3 . . . in LEDs" Lux et al. 1997.*
126: 251685 A Joint . . . Poly (P–Phenylene Vinylene) Fahlner et al. 1997.*
126: 39388 "Electroluminescent Device . . . for their Use" Cumming et al 1996.*
126: 24299 "Polymer LED Utilizing Poly(Arylene Vinylenes" Ohnishi et al 1996.*
125:233956 "Polymeric . . . Electroluminescent Device" Ohnishi et al 1996.*
125: 287755 "Systematic . . . Diode Performance" Joswick et al 1996.*
125: 180932 "Polymers for use in Optical Devices" Almes et al 1996.*
125: 179869 "Towards . . . Banc Phenomera" Corvil et al 1996.*
124: 301400 "Poly(P–Phenylene Vinylene . . . Derivatization" Corvil et al 1996.*
124: 318374 Photoinduced . . . (P–Phenylene–Vinylene) Harrison et al 1996.*
124: 215695 "Organic FT Devices" Inoe et al 1996.*
124: 215580 "Charge Transport . . . Diodes" Li et al. 1995.*
124: 159759 "The Synthesis . . . Diodes" Spangler et al. 1995.*

(List continued on next page.)

*Primary Examiner*—Duc Truong
(74) *Attorney, Agent, or Firm*—Joseph C. Gil; Aron Preis

(57) ABSTRACT

An electroluminescent device comprising an oligomer of substituted p-divinylbenzene is disclosed. The oligomer has the general formula (I)

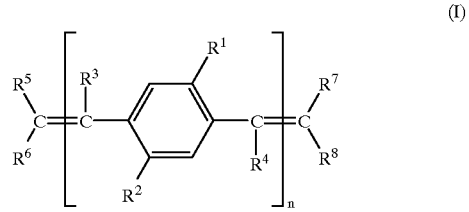

in which $R^1$ and $R^2$ independently denote a member selected from the group consisting of hydrogen, linear alkyl containing 1 to 12 carbon atoms, linear alkoxy containing 1 to 12 carbon atoms, branched alkyl containing 3 to 12 carbon atoms, branched alkoxy containing 3 to 12 carbon atoms and cycloalkyl containing 4 to 10 carbon atoms with the proviso that $R^1$ and $R^2$ may not both be hydrogen, $R^3$ and $R^4$ independently denote hydrogen, $C_1$–$C_6$-alkyl, CN or halogen, $R^5$, $R^6$ $R^7$ and $R^8$ independently denote any desired radicals, and n is 2 to 20.

9 Claims, No Drawings

OTHER PUBLICATIONS

123: 354684 "New Copolymers . . . Organic LEDs" Spangler et al 1995.*

122: 277688 "Electroluminescent . . . Polymers" Cumming et al. 1994.*

122: 146713 "Electroluminescent . . . Compositions" Holmes et al. 1994.*

121: 166207 "Electroluminescence . . . Dyes" Frederiksen et al 1994.*

121: 68996 "Blue Electroluminescent . . . Matrix" Tachelet et al. 1994.*

120: 148263 "Organic Thin Film Electroluminescent Elements" Oonishi et al 1993.*

117: 16985 "Organic Thin Film Electroluminescent Device" Togashi et al 1991.*

112: 27840 "Electroluminescent . . . Materials" Hirokawa et al. 1989.*

Adv. Mater. 4, (month unavailable) 1992, No. 1, pp. 36–37, Realization of a Blue–Light–Emitting Device using Poly(p–phenylene) by Grem et al.

J. Chem. Soc., Chem. Commun., pp. 32–34, (month unavailable) 1992, Synthesis of a Segmented Conjugated Polymer Chain Giving a Blue–shifted Electroluminescence and Improved Efficiency, Burn et al.

Polymer, Jun. 1990, vol. 31, pp. 1137–1141, Polyarylenevinylene films prepared from precursor polymers soluble in organic solvents,1 Tokito et al.

Physical Review B, vol. 42, No. 18, Dec. 15, 1990, pp. 11670–11681, Friend et al, Photoexcited states in poly(p–phenylene vinylene): Comparison with trans, trans–distyrylbenzene, a model oligmer.

Pure & Appl. Chem., vol. 67, No. 1, pp. 175–182, (month unavailabale) 1995, Stolka et al, Electroluminescence from single layer molecularly doped polymer films.

Adv. Mater. 7, No. 6, (month unavailable) 1995, pp. 551–554, Bassler et al, Efficient Two Layer LEDs on a Polymer Blend Basis.

Appl. Phys. Lett., 67(16), Nagai et al, pp. 2281–2283, Single–layer white light–emitting organic electroluminescent devices based on dye–dispersed poly(N–vinylcarbazole).

J. Am. Chem. Soc., (month unavailable) 1990, 112, pp. 3875–3886, Schrock et al, Synthesis of Molybdenum Imido Alkylidene Complexes and Some Reactions Involving Acyclic Olefines.

Macromol. Rapid Commun. 16, (month unavailable) 1995, pp. 147–153, Synthesis of soluble, all–trans poly (2,5–diheptyl–p–phenylenevinylene) via metathesis polycondensation, Thorn–Csanyi et al.

Macromol. Symp. 122, pp. 77–81, Aug., 1997, XP000727257, Synthesis of Thermotropic Liquid Crystalline All–TRANS–p–Phenylenevinylene Oligomers via Two–Step Metathesis, Thorn–Csanyi et al.

Macromolecular Chemistry & Physics, vol. 198, No. 12, Dec. 1, 1997, pp. 3827–3843, XP000738946, All–trans oligomers of 2,5–dialkyl–1,4–phenylenevinylenes–metathesis preparation and characterization, Thron–Csanyi et al.

Optical Materials, vol. 9, No. 1–4, Jan. 1, 1998, pp. 77–81. XP004123002, Relationship between structure and electroluminescence of oligo(p–phenylenevinylene)s, Stalmach et al.

Macromol. Chem. Phys., vol. 197, pp. 113–134, Jan. 1, 1996, XP000587603, Preparation and structure–property relationships of polymeric materials containing arylenevinylene segments—perspectives for new light–emitting materials, Greiner et al.

Advanced Materials, vol. 9, No. 8, Jun. 1, 1997, pp. 639–643, Oligophenylenevinylenes for Light–Emitting Diodes, Goodson III, et al.

Journal of Molecular Catalysis 90 (1–2), pp. 29–37, XP002112871, (Month unavailable) 1994, Metathetic incorporation of preformed defined p–phenylenevinylene sequences into commercially available neodymium butadiene rubber, Thron–Csanyi et al.

Macromol. Rapid Commun. 19, No. 4, Apr. 1, 1998, pp. 223–228, XP000771935, Synthesis of soluble all–trans oligomers of 2,5–diheptyloxy–p–phenylenevinylene via olefin metathesis, Thorn–Csanyi et al.

Macromol. Rapid Commun., vol. 16, No. 2, pp. 149–153, Feb. 1, 1995, XP000486274.

Synthesis of soluble, all–trans poly(2,5–diheptyl–p–phenylenevinylene) via metathesis poly–condensation, Thorn–Csanyi et al.

* cited by examiner

ELECTROLUMINESCENT DEVICES USING BLEND SYSTEMS

An electroluminescent (EL) device is characterized in that it emits light when an electrical voltage is applied and current flows. Such devices have long been known in engineering as "light-emitting diodes" (LEDs). The emission of light is due to the fact that positive charges ("holes") and negative charges ("electrons") recombine with the emission of light.

In the development of light-emitting components for electronics or photonics, use is mainly made at present of inorganic semiconductors, such as gallium arsenide. Punctiform indicating elements can be produced on the basis of such substances. Large-area devices are not possible.

In addition to semiconductor light-emitting diodes, electroluminescent devices based on vapour-deposited low-molecular-weight organic compounds are known U.S. Pat. No. 4,539,507, U.S. Pat. No. 4,769,262, U.S. Pat. No. 5,077,142, EP-A 406 762, EP-A 278 758, EP-A 278 757).

Furthermore, polymers, such as poly(p-phenylenes) and poly(p-phenylenevinylenes) (PPV) are described as electroluminescent polymers: G. Leising et al., Adv. Mater. 4 (1992) No. 1; Friend et al., J Chem. Soc., Chem. Commun. 32 (1992); Saito et al., Polymer, 1990, Vol. 31, 1137; Friend et al., Physical Review B, Vol. 42, No. 18, 11670 or WO 90/13148. Further examples of PPV in electroluminescent indicators are described in EP-A 443 861, WO-A-9203490 and 92003491.

EP-A 0 294 061 discloses an optical modulator based on polyacetylene.

Heeger et al. have proposed soluble, conjugated PPV derivatives for producing flexible polymeric LEDs (WO 92/16023). Polymer blends of various compositions are likewise known: M. Stolka et al., Pure & Appl. Chem., Vol. 67, No. 1, pp 175–182, 1995; H. Bässler et al., Adv. Mater. 1995, 7, No. 6, 551; K. Nagai et al., Appl. Phys. Lett. 67 (16), 1995, 2281; EP-A 532 798.

As a rule, the organic EL devices contain one or more layers of organic charge transport compounds. The basic structure of the layer sequence is as follows:
1 Carrier, substrate
2 Base electrode
3 Hole-injecting layer
4 Hole-transporting layer
5 Light-emitting layer
6 Electron-transporting layer
7 Electron-injecting layer
8 Top electrode
9 Contacts
10 Packaging, encapsulation.

The layers 3 to 7 are the electroluminescent element.

This structure is the most general case and can be simplified by omitting individual layers so that one layer assumes a plurality of tasks. In the simplest case, an EL device comprises two electrodes between which an organic layer is situated which fulfils all the functions, including the emission of light. Such systems are described, for example, in Application WO 90/13148 on the basis of poly(p-phenylenevinylene).

Multilayer systems can be constructed by vapour-deposition processes in which the layers are applied successively from the gas phase or by pouring methods. Because of the higher processing speed, pouring methods are preferred. However, in certain cases, the process of partially dissolving a layer already applied may present a difficulty in depositing the next layer on top.

The object of the present invention is to provide electroluminescent devices having high luminous density, the mixture to be applied being pourable, i.e. capable of being applied from solution.

It was found that electroluminescent devices containing material A or a blend of material A with polymeric binder B, mentioned below fulfil these requirements. In the following, the term zone is also to be equated with layer.

The present invention therefore relates to electroluminescent devices containing, as electroluminescent material A, at least one oligomer of substituted p-divinylbenzene having the general formula (I)

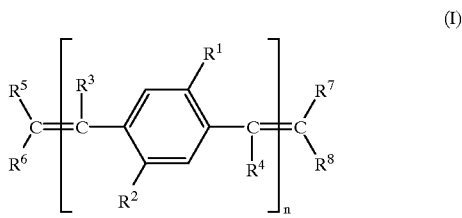

in which
$R^1$ and $R^2$ independently represent hydrogen, or linear alkyl or alkoxy containing 1 to 12 carbon atoms, preferably 1 to 8 carbon atoms, or branched alkyl or alkoxy containing 3 to 12, preferably 3 to 8 carbon atoms, or cycloalkyl containing 4 to 10, preferably 5 or 6 carbon atoms, with the proviso that
$R^1$ and $R^2$ may not both by hydrogen,
$R^3$ and $R^4$ are identical or different and represent hydrogen, $C_1$–$C_6$-alkyl (preferably methyl or ethyl), CN or halogen (preferably fluorine, chlorine or bromine),
$R^5$, $R^6$ $R^7$ and $R^8$ are identical or different and may be any desired radicals, inter alia, radicals suitable for coupling oligomers to other oligomers/polymers,
n is an integer from 2 to 20, preferably 2 to 15 and particularly preferably 2 to 10,
$R^5$ and $R^7$ represent independently of one another, preferably hydrogen or alkyl, in particular $C_1$–$C_4$-alkyl, very particularly preferably methyl,
$R^6$ and $R^8$ represent, independently of one another, preferably alkyl or aryl radical, in particular $C_1$–$C_6$-alkyl or phenyl. The alkyl and phenyl radicals may contain one or more functional groups, such as, for example, —OH, —CN, —CHO or Br.

With suitable substitution, the oligomers of substituted divinylbenzene may also be incorporated, for example, in polymers as discussed below, by means of functional groups. In this connection, it is possible to produce both main-chain and side-chain polymers containing low-molecular-weight compounds.

The oligomers may be coupled to polymers containing double bonds, for example unsaturated polymers, such as polybutadiene and polyoctamer by metathetic incorporation (cross-metathesis reaction of the oligomers and an unsaturated polymer).

The electroluminescent device is made up of an anode, an electroluminescent element and a cathode, at least one of the two electrodes being transparent or semi transparent in the visible spectral range. The electroluminescent element contains:

A hole-injecting zone, a hole-transporting zone, an electroluminescent zone, an electron-transporting zone and/or an electron-injecting zone, characterized in that the electroluminescent element optionally contains a functionalized compound from the group comprising the hole-transporting materials, a luminescent material A and, optionally, electron-transporting materials, at least one zone being present, individual zones being omitted and the joined zone(s) taking over a multiplicity of tasks.

A zone can take over a multiplicity of tasks, i.e., a zone may contain, for example, hole-injecting, hole-transporting, electroluminescent, electron-injecting and/or electron-transporting substances.

The electroluminescent element may furthermore contain one or more transparent polymeric binders B.

An additional embodiment of the invention relates to the device comprising the product of reaction of the oligomer of formula (I) and a polymeric resin containing double bonds, for example unsaturated polymers, such as polybutadiene or polyoctamer.

The oligomers of substituted p-divinylbenzene may be produced by known methods, for example by metathesis reactions, which are described in Macromol. Rapid Commun., 16 (1995), 149 (cf. also Examples).

The products are soluble in common solvents. They can be processed to form transparent films which, depending on the value of n and/or the choice of substituents on the phenyl ring, exhibit different photoluminescents. By varying n and/or the choice of the substituents, the wavelength (color) of the emitted light can therefore be systematically adjusted.

The binder B represents polymers and/or copolymers, such as, for example, polycarbonates, polyester carbonates, copolymers of styrenes, such as SAN or styrene acrylates, polysulfones, polymers based on vinyl-group-containing monomers, such as, for example, poly(meth)acrylates, polyvinylpyrrolidone, polyvinylcarbazole, vinyl-acetate and vinyl-alcohol polymers and copolymers, polyolefins, cyclic olefin copolymers, phenoxy resins, etc. Mixtures of different polymers can also be used. The polymeric binders B have molecular weights of from 10,000 to 200,000 g/mol., are soluble and film-forming and are transparent in the visible spectral range. They are described, for example, in Encyclopedia of Polymer Science and Engineering, 2nd ed., A. Wiley-Interscience Publication. The electroluminescent material A may be dispersed in the transparent binders B. The concentration ratios are variable as desired. Binder B is normally used in an amount of up to 95, preferably up to 80%, based on the total weight of A and B.

To produce the layer, the components A) and, optionally, B) are dissolved in a suitable solvent, such as chloroform and are applied to a suitable substrate by pouring, doctor-blading or spin-coating. Suitable substrates include glass or a plastics material which is provided with a transparent electrode. A sheet of polycarbonate, polyester, such as polyethylene terephthalate or polyethylene naphthalate, polysulfone or polyimide may be used as plastics material.

Suitable as transparent or semi transparent electrodes are:
a) metal oxides, for example indium/tin oxide (ITO), tin oxide (NESA) zinc oxide, doped tin oxide, doped zinc oxide, etc.,
b) semi-transparent metal films, for example, Au, Pt, Ag, Cu, etc.,
c) conductive polymer films, such as polyanilines, polythiophenes, etc.

The metal oxide film electrodes and the semi-transparent metal-film electrodes are applied by procedures such as vapor deposition, sputtering, platinum, coating, etc., in thin layer. The conductive polymer films are applied by procedures such as spin-coating, casting, doctor-blading, etc., from solution.

The thickness of the electrode is at least 3 nanometers (nm), preferably 10 nm to 500 nm.

The electroluminescent layer is applied directly as a thin film to the electrode or to an optionally present charge-transporting layer. The thicknesses of the film is 10 to 500 nm, preferably 20 to 400 nm, particularly preferably 50 to 250 nm.

A further charge-transporting layer may be inserted on the electroluminescent layer before a counterelectrode is applied.

An assembly of suitable charge-transporting interlayers which may be hole-conducting and/or electron-conducting materials which may be present in polymeric or low-molecular-weight form, optionally as a blend, is disclosed in EP-A 532 798, incorporated herein by reference. Particularly suitable are specially substituted polythiophene which have hole-transporting properties. They are described, for example, in EP-A 686 662 incorporated herein by reference.

The content of low-molecular-weight hole conductor in a polymer binder can be varied in the range from 2 to 97%; preferably, 5 to 95%, particularly preferably 10 to 90%, in particular 10 to 85% relative to the weight of the polymeric binder and hole conductor. The hole-injecting or hole-conducting zones can be deposited by various methods.

Film-forming hole conductors can also be used in pure form (100%). Optionally, the hole-injecting or hole-conducting zone may also contain proportions of an electroluminescent substance.

Blends which are composed exclusively of oligomers of substituted divinylbenzene may be vapor-deposited; soluble and film-forming blends, which may also contain (not necessarily) a binder B) in addition to low-molecular-weight compounds, may be deposited from a solution, for example, by means of spin-coating, pouring or doctor-blading.

It is also possible to apply emitting and/or electron-conducting substances in a separate layer to the hole-conducting layer containing the component A. In this connection, an emitting substance may also be added (as "dopant") to the layer containing the compound A and an electron-conducting substance additionally applied. An electroluminescent substance may also be added to the electron-injecting or electron-conducting layer.

On the other hand, the electroluminescent materials A) may themselves also be used as dopants in electroluminescent devices.

The content of low-molecular-weight electron conductors in the polymeric binder can be varied in the range from 2 to 95%, preferably, 5 to 90%, particularly preferably 10 to 85% relative to the total weight of electron conductor and binder. Film-forming electron conductors may also be used in pure form (100%).

The counterelectrode is composed of a conductive substance, which may be transparent. Preferably, metals, for example Al, Au, Ag, Mg, In, etc. or alloys and oxides of the later which can be applied by procedures such as vapor deposition, sputtering or platinum coating, are suitable.

The device according to the invention is brought into contact with the two electrodes by two electrical leads (for example, metal wires).

When a direct voltage in the range from 0.1 to 100 volts is applied, the devices emit light of a wavelength from 200 to 2000 nm. They exhibit photoluminescence in the range from 200 to 2000 nm.

The devices according to the invention are suitable for producing units for the purpose of illumination and for the purpose of displaying information.

Guidelines

1. Metathetic preparation of ring-substitution p-phenylenevinylene oligomers (and polymers)

Starting from a 2,5-ring-substituted 1,4-(bis-1-alkenyl) benzene, such as, for example, 1,4-divinylbenzene, 1,4-di (1-propenyl)benzene, 1,4-di(1-isobutenyl)benzene etc. and adding a metathesis-active catalyst, such as, for example, $Mo(NAr^{Me2})(CHCMe_2Ph)[OCMe(CF_3)_2]_2$, oligomerization (metathetic polycondensation) is carried out by cleaving and removing a low-molecular-weight monoolefin, such as, for example, ethene, 2-butene, 3-hexene, etc. Scheme 1 shows the reaction equation for the metathetic conversion of 2,5-disubstituted 1,4-divinylbenzenze.

$Mo(NAr^{Me2})(CHCMe_2Ph)[OCMe(CF_3)_2]_2$: The synthesis is carried out according to the literature specification of R. R. Schrock, J. S. Murdzek, G. C. Bazan, J. Robbins, M. DiMare, M. O'Regan, J. Chem. Soc., 112 (1990), 3875.

Scheme 1

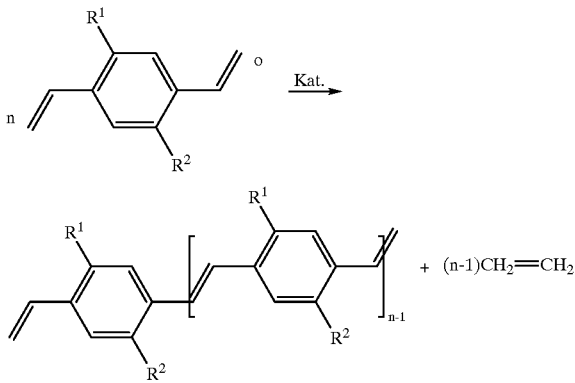

$R^1$ and $R^2$ independently are hydrogen, alkyl or alkoxy substituents, and n is 2 to 20.

The polycondensation reactions are carried out under an inert gas stream, argon being used, from which oxygen traces and water traces and water traces are removed ($<10^{-5}$% by volume) by means of an "Oxisorb$^R$" miniature absorber (supplied by Messer-Grieβheim, Duisburg, Germany). A schlenk tube or a flask provided with inert gas and vacuum connections (standard Schlenk technique) is used as reaction vessel.

Before use, the glassware is baked out for approximately 4 hours under a mercury-diffusion-pump vacuum and then filled with argon.

The solvents toluene, decalin, cyclohexane, hexane, pentane are refluxed for 2 to 3 days over lithium alanate and distilled off under argon. 0.5 ml of n-butyllithium are then added to 250 ml of solvent, subjected to a plurality of freezing/thawing cycles until vacuum constancy is reached (mercury-diffusion-pump vacuum) and condensed over into a stock vessel.

The polycondensation of dibutyl-, diheptyl- or didecyl-substituted divinylbenzenes and the protection (cross metathesis) of the alkyl-substituted p-divinylbenzene oligomers are carried out at room temperature. The conversion of dicyclohexyl- or diheptyloxy-substituted p-divinylbenzenes is carried out at an elevated temperature of 50° C. and up to 80° C.

EXAMPLES

Synthesis of Oligomers of 2,5-Heptyl-substituted 1, 4-Divinylbenzene a) Preparation of Oligomers Having Narrow Dispersity 68 mg (208 μmol) of 2,5-diheptyl-1,4-divinylbenzene are introduced as a solid into a Schlenk tube provided with protective gas and vacuum connections and the reaction is started by rapidly adding the catalyst solution (0.5 ml of a toluene solution of $Mo(NAr)(CHAr')[OC(CH_3)(CF_3)_2]_2$) with the concentration of C=6.7 mmol./l. The polycondensation is carried out in sealed equipment at reduced pressure with constant stirring. Ethene is removed by repeatedly applying a reduced pressure for a short time to the reaction flask (approximately 3 times in the first hour, then about every 6 hours) to shift the equilibrium of the reaction to the polycondensate side.

After a reaction time of 24 hours, the experiment is terminated by adding propanal. Propanal makes possible the defined termination of the metathesis reaction by means of a reaction analogous to the Wittig reaction. The reaction mixture is taken up in 30 ml of toluene and then filtered. The product is obtained by precipitation in 100 ml of methanol after filtration, drying and extraction by means of chloroform.

The product isolated exhibits a narrow molecular-weight distribution (GPC). The chain length was 10 to 11 ($^1$H-NMR; n=number of α-methylene protons/number of vinyl protons), $^1$H-NMR (100 MHz, CDCl$_3$); δ (ppm)=7.43 (Ar—H); 7.23 (Ar—CH=CH—Ar, trans-vinylene); 6.97 (Ar—CH=CH$_2$); 5.67 (trans-vinyl terminal group proton); 5.26 (cis-vinyl terminal group proton); 2.75 (α-CH$_2$); 1.10–1.70 (β-ξ-CH$_2$), 0.89 —CH$_3$, UV/Vis (in THF), λ (nm)=395.

b) Preparation of Oligomers with Wide Molecular-weight Distribution 2 g (6.12 mmol) of 2,5-diheptyl-1,4-divinylbenzene are dried for several hours in a mercury diffusion-pump vacuum in a flask provided with inert gas and vacuum connections. Then 50 ml of pentane and 0.123 mmol of catalyst dissolved in 17 ml of pentane (c=7.22 mmol/l) are added. After applying a slight vacuum, the reaction mixture is stirred for 24 hours at room temperature under an inert gas atmosphere. After adding 3 ml of propionaldehyde, the solvent is removed using a rotary evaporator, the crude product is taken up in toluene and the higher-molecular-weight oligomer fraction is precipitated by adding double the volume of methanol. This product is filtered off, predried in an oil-pump vacuum (=10$^{-2}$ bar) for 10 hours and then dried for a further 10 hours in a mercury diffusion-pump vacuum. 1.05 g (56%) of oligomer having a mean degree of polymerization of 6 to 7 are obtained as a green, fluorescent solid. Product characterization:

$^1$H-NMR (CDCl$_3$, 100 MHz) δ (ppm)=7.42 (Ar—H); 7.23 (Ar—CH=CH—Ar, trans-vinylene); 6.95 (Ar—CH=CH$_2$); 5.67 (trans-vinyl terminal group proton); 5.27 (cis-vinyl terminal group proton); 2.76 (α-CH$_2$); 1.10–1.70 (β-ξ-CH$_2$-); 0.88 —CH$_3$, UV/Vis (in THF), λ (nm)=390 (π-π')

c) Protection of the Oligomers Prepared; Cross-metathesis with Trans-3-hexene, i.e. for example: $R_5$ and $R_7$=H and $R_6$ and $R_8$=ethyl.

The cross-metathesis experiments are carried out in the solvent toluene. The substituted divinylbenzene oligomers prepared in hexane are used.

Catalyst: oligomer: trans-3-hexene=1:10:300, the catalyst concentration is 1 mmol/l.

The reaction is carried out at room temperature and terminated after one day by adding propanal. Solvents and volatile substances are removed by means of oil-pump vacuum. Then the residue is taken up in toluene and the solution is added dropwise to a precipitation bath (methanol) via a paper filter. The product is extracted by means of a Büchner funnel and adhering solvent residues are removed in a mercury diffusion-pump vacuum.

The working-up was identical to that of the unprotected substituted divinylbenzene oligomers.

The protection of the terminal vinyl double bonds proceeds quantitatively and highly selectively. The product is characterized by $^1$H-NMR, UV/Vis-IR, DSC and GPC analyses, and, in the case of the protected monomer (n=1), additionally with the aid of gas chromatography.

2. Structure of the Electroluminescent Devices.

In the examples described below, a glass plate (Baltracon 255 supplied by Balzers) is used which is coated with ITO (indium-tin oxide) and which is additionally provided with an approximately 30 to 50 nm thick layer of polyethylene dioxythiophene (PEDT)/polystyrene sulfonate (PSS)—Baytron® P from Bayer AG, Leverkusen, Germany—on the ITO surface. The 2,5-diheptyl-1,4-divinylbenzene with n=6–7, terminal group: CH—CH$_2$—CH$_3$, i.e. R$_5$ and R$_7$=H and R$_6$ and R$_8$=ethyl, is used as electroluminescent material. A 1.5% solution composed of polyvinylcarbazole (PVK)-Luvican EP from BASF AG, Ludwigshafen, Germany and 2,5-diheptyl-1,4-divinylbenzene oligomer (n=6=7), at a weight ratio of 1:1, in chloroform is spread over an ITO/PEDT/PVK substrate on a commercial spin coater at a rotational speed of 400 min$^1$. The layer thickness is 100 nm. Aluminum is vapor-deposited as counterelectrode.

After contacting and applying an electrical field, the device exhibits visually 353 perceptible electroluminescence in the blue spectral region at about 6 V.

b) The structure described under a) is extended by vapor-depositing a 30 nm thick layer of aluminum oxine (Alq$_3$) on the layer of PVK.

After making contact and applying an electrical field, the device exhibits visually perceptible electroluminescence in the green spectral range at about 6 V.

c) The structure is analogous to b) with the difference that PVK is replaced by polystyrene.

After making contact and applying an electrical field, the device exhibits visually perceptible electroluminescence in the green spectral range from about 6 V.

What is claimed is:

1. An electroluminescent device, comprising an oligomer of substituted p-divinylbenzene of the general formula (I)

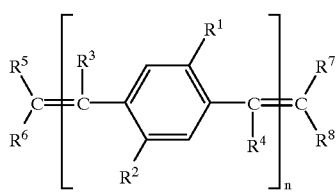

(I)

in which

R$^1$ and R$^2$ independently denote a member selected from the group consisting of hydrogen, linear alkyl containing 1 to 12 carbon atoms, linear alkoxy containing 1 to 12 carbon atoms, branched alkyl containing 3 to 12 carbon atoms, branched alkoxy containing 3 to 12 carbon atoms and cycloalkyl containing 4 to 10 carbon atoms with the proviso that R$^1$ and R$^2$ may not both be hydrogen, R$^3$ and R$^4$ independently denote hydrogen, C$_1$–C$_6$-alkyl, CN or halogen, R$^5$ and R$^7$ independently denote hydrogen or alkyl radicals and R$^6$ and R$^8$ independently denote an alkyl radical optionally containing one or more functional groups, and n is 2 to 20.

2. The electroluminescent device of claim 1, wherein R$^5$ and R$^7$ independently denote C$_1$–C$_4$-alkyl.

3. The electroluminescent device of claim 2, wherein R$^5$ and R$^7$ denote methyl groups.

4. The electroluminescent device of claim 1 wherein R$^6$ and R$^8$ independently denote C$_1$–C$_6$-alkyl.

5. The electroluminescent device of claim 4 wherein alkyl radicals contain at least one functional group selected from the group consisting of —OH, —CN, —CHO and Br.

6. The electroluminescent device of claim 1 further comprising a binder B.

7. The electroluminescent device of claim 6 wherein binder B is selected from the group consisting of polycarbonate, polyester carbonate, copolymer of styrene, polysulfone, polymer based on vinyl-group containing monomers, polyolefin and phenoxy resin.

8. The electroluminescent device comprising the reaction product of an oligomer of substituted p-divinylbenzene of the general formula (I)

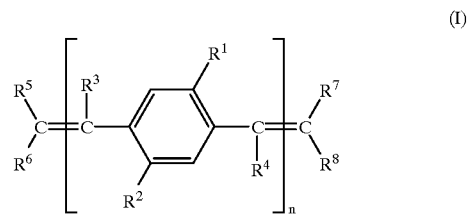

(I)

in which

R$^1$ and R$^2$ independently denote a member selected from the group consisting of hydrogen, linear alkyl containing 1 to 12 carbon atoms, linear alkoxy containing 1 to 12 carbon atoms, branched alkyl containing 3 to 12 carbon atoms, branched alkoxy containing 3 to 12 carbon atoms and cycloalkyl containing 4 to 10 carbon atoms with the proviso that R$^1$ and R$^2$ may not both be hydrogen, R$^3$ and R$^4$ independently denote hydrogen, C$_1$–C$_6$-alkyl, CN or halogen, R$^5$ and R$^7$ independently denote hydrogen or alkyl, R$^6$ and R$^8$ independently denote alkyl radicals and n is 2 to 20, with at least one polymeric resin containing double bonds.

9. The electroluminescent device of claim 8 wherein said polymeric resin is a member selected from the group consisting of polybutadiene and polyoctamer.

* * * * *